United States Patent
Balasubramanian

(10) Patent No.: US 9,250,673 B2
(45) Date of Patent: Feb. 2, 2016

(54) POWER OVER ETHERNET PARAMETER STORAGE

(71) Applicant: Cisco Technology, Inc., San Jose, CA (US)

(72) Inventor: Koussalya Balasubramanian, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 302 days.

(21) Appl. No.: 13/912,292

(22) Filed: Jun. 7, 2013

(65) Prior Publication Data

US 2014/0365805 A1  Dec. 11, 2014

(51) Int. Cl.

| | | |
|---|---|---|
| *G06F 1/26* | (2006.01) | |
| *G06F 1/32* | (2006.01) | |
| *G06F 1/28* | (2006.01) | |
| *H04L 12/10* | (2006.01) | |
| *H01L 27/10* | (2006.01) | |
| *G01R 31/36* | (2006.01) | |
| *G01R 27/18* | (2006.01) | |

(52) U.S. Cl.
CPC ........ *G06F 1/28* (2013.01); *H04L 12/10* (2013.01); *G01R 27/18* (2013.01); *G01R 31/3624* (2013.01); *H01L 27/101* (2013.01)

(58) Field of Classification Search
CPC ......... G06F 1/28; H01L 27/101; G01R 27/18; G01R 31/3624
USPC .................................................. 713/300, 340
See application file for complete search history.

(56) References Cited

U.S. PATENT DOCUMENTS

| | | |
|---|---|---|
| 7,613,939 B2 | 11/2009 | Karam et al. |
| 8,171,315 B2 | 5/2012 | Karam et al. |
| 8,356,191 B2 | 1/2013 | Schindler |
| 2010/0060295 A1* | 3/2010 | Ishikawa et al. ............. 324/601 |
| 2011/0022860 A1* | 1/2011 | Schindler ...................... 713/300 |

\* cited by examiner

*Primary Examiner* — Michael J Brown
(74) *Attorney, Agent, or Firm* — Edell, Shapiro & Finnan, LLC

(57) ABSTRACT

Presented herein are techniques for storing parameter values determined by a power sourcing equipment (PSE) device during a Power over Ethernet (PoE) detection process. More specifically, in one example, a voltage is applied to an end device connected, via an Ethernet cable, to a port of the PSE device. The PSE device measures the current drawn by the end device and calculates, based on the measured current, a resistance and/or a capacitance value for the end device. The resistance and/or capacitance values are then stored in a memory of the PSE device.

20 Claims, 3 Drawing Sheets

POWER OVER ETHERNET PARAMETER STORAGE

TECHNICAL FIELD

The present disclosure relates to Power over Ethernet (PoE) systems and devices.

BACKGROUND

Power over Ethernet (PoE) is a technology for wired Ethernet local area networks (LANs) in which the Ethernet cables simultaneously supply power and data to network devices. Electrical current necessary for the operation of each device is carried by the data cables rather than by separate power cords and separate power supplies. PoE is governed by the Institute of Electrical and Electronics Engineers (IEEE) 802.3at standard and the earlier 802.3af standard.

In accordance with the PoE standards, a device may either transmit/send power or receive power, but may not perform both functions. Devices that send power are referred to as PoE power sourcing equipment (PSE) or PSE devices, while devices that receive power are referred to as powered devices (PDs).

DESCRIPTION OF EXAMPLE EMBODIMENTS

Overview

Presented herein are techniques for storing parameter values determined by a PSE device during a detection process. More specifically, in one example, voltage is provided to an end device connected, via an Ethernet cable, to a port of the PSE device. The PSE device measures the current drawn by the end device and calculates, based on the measured current, resistance and/or capacitance values for the end device. The resistance and/or capacitance values are then stored in a memory of the PSE device.

Example Embodiments

Figure 1:
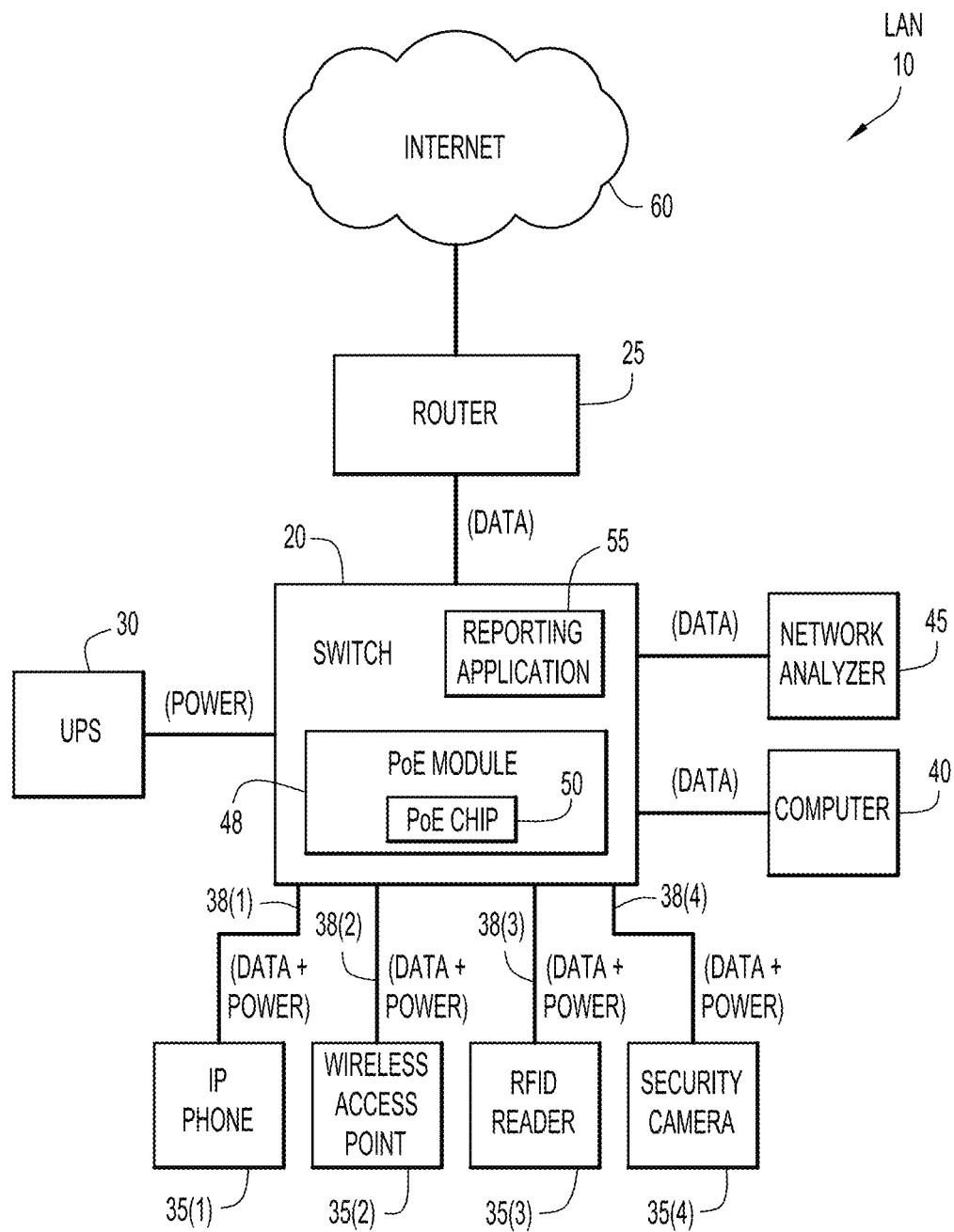
FIG. 1 is a block diagram of a network including a PSE device in accordance with examples presented herein.

FIG. 1 is a block diagram of a local area network (LAN) 10 in an enterprise environment. The LAN 10 comprises a Power over Ethernet (PoE) switch 20 that is configured to provide power and/or data to other devices in the LAN. As such, switch 20 is also referred to herein as a power sourcing equipment (PSE) device. The switch 20 comprises a PoE module 48 and a reporting application 55.

It is to be appreciated that PoE functionality of PoE module 48 may be implemented in a number of different ways (e.g., in various hardware and/or software elements) within switch 20. In one example, the PoE module 48 comprises one or more PoE chips, sometimes referred to as PSE chips, PoE integrated circuits (ICs), PoE controllers, etc. Although a plurality of PoE chips may be used in practice, for ease of illustration the example of FIG. 1 will be described with reference to a single PoE chip 50 within PoE module 48.

The LAN 10 of FIG. 1 also comprises a router 25, a universal power supply (UPS) 30, a plurality of powered devices (PDs) 35(1)-35(4), a computer 40, and a network analyzer 45. In the example of FIG. 1, the switch 20 is configured to transmit/receive data over the Internet 60 via router 25. The switch 20 is also configured to directly receive power from the UPS 30. The switch 20 is configured to transmit data to, and/or receive data from, computer 40 and network analyzer 45.

As shown in FIG. 1, the switch 20 is connected to each of the powered devices 35(1), 35(2), 35(3), and 35(4) via a respective one of the Ethernet cables 38(1), 38(2), 38(3), and 38(4). The switch 20 is configured to provide power and data to each of the powered devices 35(1), 35(2), 35(3), and 35(4) via the respective Ethernet cable 38(1), 38(2), 38(3), and 38(4). In the example of FIG. 1, the powered device 35(1) is an Internet Protocol (IP) phone, the powered device 35(2) is a wireless access point, the powered device 35(3) is a Radio Frequency Identification (RFID) reader, and the powered device 35(4) is a security camera. It is to be appreciated that the types and number of powered devices shown in FIG. 1 are merely illustrative.

The PoE chip 50 of switch 20 comprises the hardware and/or software elements that provide the PoE functionality of switch 20. That is, PoE chip 50 comprises the elements that are configured to provide power and data to powered devices 35(1)-35(4).

In accordance with the PoE standards, PSE devices have a mechanism that is designed to prevent power from being provided to incompatible devices. That is, when an end device is connected to a PSE device via an Ethernet cable, the PSE device will execute a detection process that determines whether or not the connected end device is a PD (i.e., a device that can receive power over the Ethernet cable) or a non-PD (i.e., a device that cannot receive power over the Ethernet cable).

During the detection process to determine whether a connected end device is a PD, the PSE device applies a small current limited direct current (DC) voltage to the connected end device between the transmit and receive pairs of the Ethernet cable, while measuring the current drawn by the connected device. If a voltage is provided at the Ethernet cable, and the connected device draws current, then a resistance and/or capacitance can be calculated. Valid PDs have a 25 kilo-Ohm (kΩ) resistor bridged across the transmit and receive pairs of the Ethernet cable, and power will only be applied to the connection if this load is detected by the PSE devices. Therefore, based on the calculated resistance and capacitance, the PSE device can determine if the connected end device is a valid PD device, a short circuit, an open circuit, etc. Devices that do not have the identified resistance and/or capacitance are deemed not to have the proper signature to trigger the PSE device to apply power.

As would be appreciated, the PSE device may not be capable of calculating a resistance value that is precisely 25 kΩ. As such, the PoE devices typically use a series of ranges for the resistance and capacitance values to determine if a connected end device is a PD. Table 1, below, illustrates example ranges that may be used in certain PoE devices.

TABLE 1

| Name | Minimum | Maximum | Unit | Description |
| --- | --- | --- | --- | --- |
| $R_{open}$ | 400 | NA | kΩ | Open port Threshold signature |
| $R_{High}$ | 33 | 100 | kΩ | High Detection Signature |
| $R_{Valid}$ | 19 | 26.5 | kΩ | Valid PD Signature - Resistance |
| $R_{Low}$ | 0.40 | 15 | kΩ | Low Detection Signature |
| $R_{short}$ | NA | 0.15 | kΩ | Shorted port threshold signature |
| $C_{good}$ | NA | 0.150 | uF | Valid PD Signature - Capacitance |
| $C_{bad}$ | 10 | NA | uF | Invalid PD Signature - Capacitance |

As shown, five (5) resistance ranges and two (2) capacitance ranges are provided. The resistance ranges are shown in Table 1 as $R_{open}$ (i.e., a resistance greater than 400 kΩ indicating an open circuit), $R_{High}$ (i.e., a resistance value of between 33 kΩ and 100 kΩ indicating a high resistance value), $R_{valid}$ (i.e., a resistance value of between 19 kΩ and 26.5 kΩ indicating a valid resistance for a PD device), $R_{Low}$ (i.e., a resistance value of between 0.40 kΩ and 15 kΩ indicating a low resistance value), and $R_{short}$ (i.e., a resistance value below 0.15 kΩ indicating a short circuit). The capacitance ranges are shown in Table 1 as $C_{good}$ (i.e., a capacitance value of below 0.150 micro-farads (uF) indicating a valid capacitance for a PD device) and $C_{bad}$ (i.e., a capacitance value of above 10 uF indicating a high capacitance).

Also as shown in Table 1, there are "gray" or undefined areas between the resistance and capacitance values. A problem that occurs is that two PSE devices, or more particularly, two PoE chips, may interpret differently values that fall within these undefined regions. For example, a PSE device may measure a resistance value of 17 kΩ for a connected end device. This value falls between the $R_{valid}$ range (19 kΩ to 26.5 kΩ) and the $R_{Low}$ (0.40 kΩ to 15 kΩ). A first PoE chip may determine that 17 kΩ is sufficiently close to the $R_{valid}$ range and, accordingly, classify the connected end device as a PD. However, a second PoE chip may determine that 17 kΩ is not sufficiently close to the $R_{valid}$ range. As such, the second PoE chip may determine that the connected end device is deemed to have a low resistance value and, accordingly, that the connected end device is not a PD device. The manner by which values that fall within the undefined regions are classified is generally set by the chip manufacturers/vendors.

The differences in how PoE chips evaluate values that fall within the undefined regions may cause considerable confusion with end users of a PSE device. For example, it is possible that the same device may be connected to different PSE devices with different results (i.e., one device detects the device as a PD, while the other device does not). In general, this causes the end user to presume that there is a problem with the PSE device/port that failed to detect the connected device as a PD, resulting in a service call or the commencement of some other time-consuming corrective process.

Described herein are techniques that provide an end user or engineer (collectively and generally referred to herein as a user) with information that may be used to quickly troubleshoot a situation where an end user believes that a device or port has incorrectly detected, or failed to detect, a PD. In the example of FIG. 1, these techniques are implemented by PoE chip 50 and reporting application 55, both of which are described further below.

Figure 2:
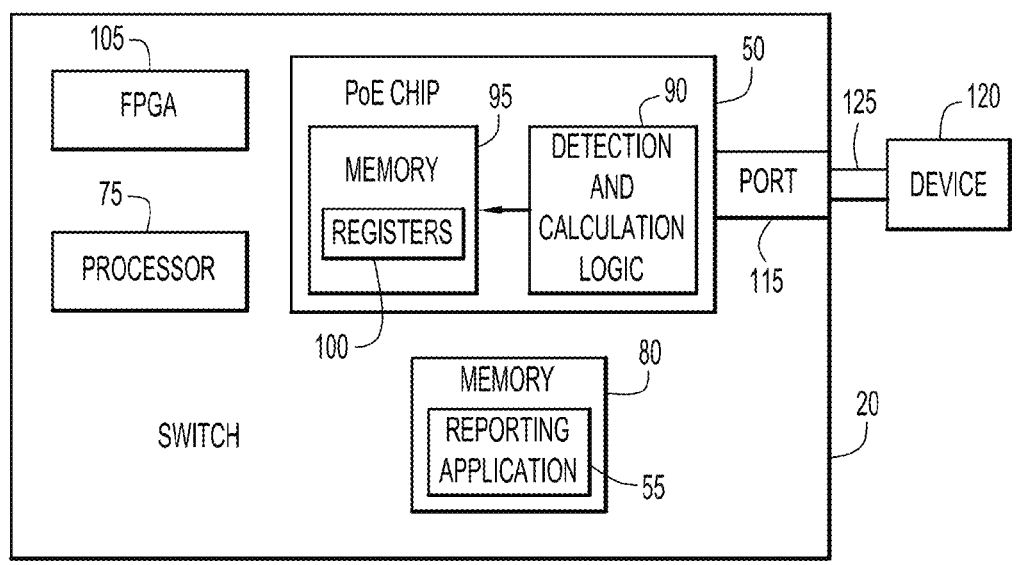
FIG. 2 is a block diagram of a PSE device in accordance with examples presented herein.

FIG. 2 is a block diagram of switch 20 illustrating further details of PoE chip 50. The PoE chip 50 comprises detection and calculation logic 90 and a memory 95 comprising a plurality of registers 100. In the example of FIG. 2, the switch 20 further comprises a field-programmable gate array (FPGA) 105, a processor 75, and a memory 80 storing instructions for a reporting application 55.

In the example of FIG. 2, the detection and calculation logic 90 comprises a collection of hardware circuit elements. However, it is to be appreciated that in other examples the detection and calculation logic 90 may partially or fully implemented as software elements.

Memories 80 and 95 may comprise read only memory (ROM), random access memory (RAM), magnetic disk storage media devices, optical storage media devices, flash memory devices, electrical, optical, or other physical/tangible memory storage devices. The processor 75 is, for example, a microprocessor or microcontroller that executes instructions for the reporting application 55. Thus, in general, the memories 80 and 95 may comprise one or more tangible (non-transitory) computer readable storage media (e.g., a memory device) encoded with software comprising computer executable instructions and when the software is executed it is operable to perform the operations described herein.

The PoE chip 50 is associated with a port 115 that is connected to an end device 120 via an Ethernet cable 125. As explained in detail above, when an end device is connected to a port of a PSE device, such as switch 20, the PSE device implements a detection process to determine if the connected end device is a PD device (i.e., a device that can receive power over the Ethernet cable) or a non-PD device (i.e., a device that cannot receive power over the Ethernet cable). In the example of FIG. 2, this detection process is executed by PoE chip 50.

More specifically, detection and calculation logic 90 will cause a small current-limited DC voltage to be applied at the Ethernet cable 125. The detection and calculation logic 90 will then measure the current drawn by the end device 120. Based on this current measurement, the detection and calculation logic 90 will generate resistance (R) and/or capacitance (C) values for the connected device 120. These resistance and capacitance values are then written into registers 100 of memory 95 for subsequent use during, for example, troubleshooting operations.

The registers 100 may include a plurality of separate registers that are used for different functions. For example, in certain arrangements the registers 100 include a first set of registers that are set when the current measurement is completed by the detection and calculation logic 90. Additionally, the registers 100 may include a second set of registers that indicate whether or not the connected device 120 is a valid PD. As such, these second set of registers may be used to trigger operations for providing power to a connected device that is a PD (e.g., classification operations, etc.). The registers 100 may include a third set of registers that include the calculated capacitance and resistance values. These registers may also include the measured current value.

During a conventional detection process of a PoE chip, calculated resistance and capacitance values are merely used to determine if the connected device is a PD or not, according to the predetermined values (e.g., Table 1) and the configuration of the PoE chip. After this determination, these values are discarded. The example of FIG. 2 has the advantage that the detection and calculation logic 90 stores the calculated resistance and capacitance values in memory locations (i.e., registers 100 in memory 95) that are accessible to outside hardware/software (i.e., hardware/software external to the PoE chip 50). For example, in one implementation, the FPGA 105 is configured to read the parameter values in registers 100 (e.g., the resistance and capacitance values) and make them available to processor 75 executing reporting application 55. Alternatively, the processor 75 may execute the reporting application 55 to read the registers 100 directly (i.e., without use of the FPGA 105). The processor 75 may also execute the reporting application 55 to, for example, transmit the resistance and capacitance values to a network analyzer 45 (FIG. 1).

As noted above, conventional PoE chips are only configured to provide an indication of whether a connected end device is a PD and do not provide an indication of the calculated resistance and capacitance values. However, in the example of FIG. 2, when an end user believes that a device or port has been incorrectly detected, or failed to detect, a PD, the storage and accessibility of the resistance and capacitance values provides a simple mechanism by which a user can troubleshoot the problem.

More specifically, when a power up failure is reported by an end user (i.e., end device 120 connected to switch 20 device does not receive power as expected), a technician, engineer, or other user may use a locally-connected or network-connected network analyzer to initiate a debug operation in the switch 20 (e.g., in the reporting application 55) to determine if a valid PD was detected on the port 115. This may also be determined by retrieving information from the registers 100 (i.e., the second set of registers described above).

Continuing with this example, if a valid PD is not reported, the user can then retrieve the resistance and capacitance values for the port 115 from the appropriate registers 100 (through reporting application 55). The retrieved resistance and capacitance values may then be compared against predetermined resistance and capacitance value ranges (e.g., Table 1). If it is determined that the measured resistance and/or capacitance values are in the "undefined" areas between the defined value ranges, a determination may be made that the end device is marginal and should be replaced.

It is to be appreciated that FIG. 2 illustrates one example arrangement for implementation of the PoE functionality presented herein. It is to be appreciated that the PoE functionality presented herein may be implemented in a number of different ways (e.g., in various hardware and/or software elements).

Figure 3:
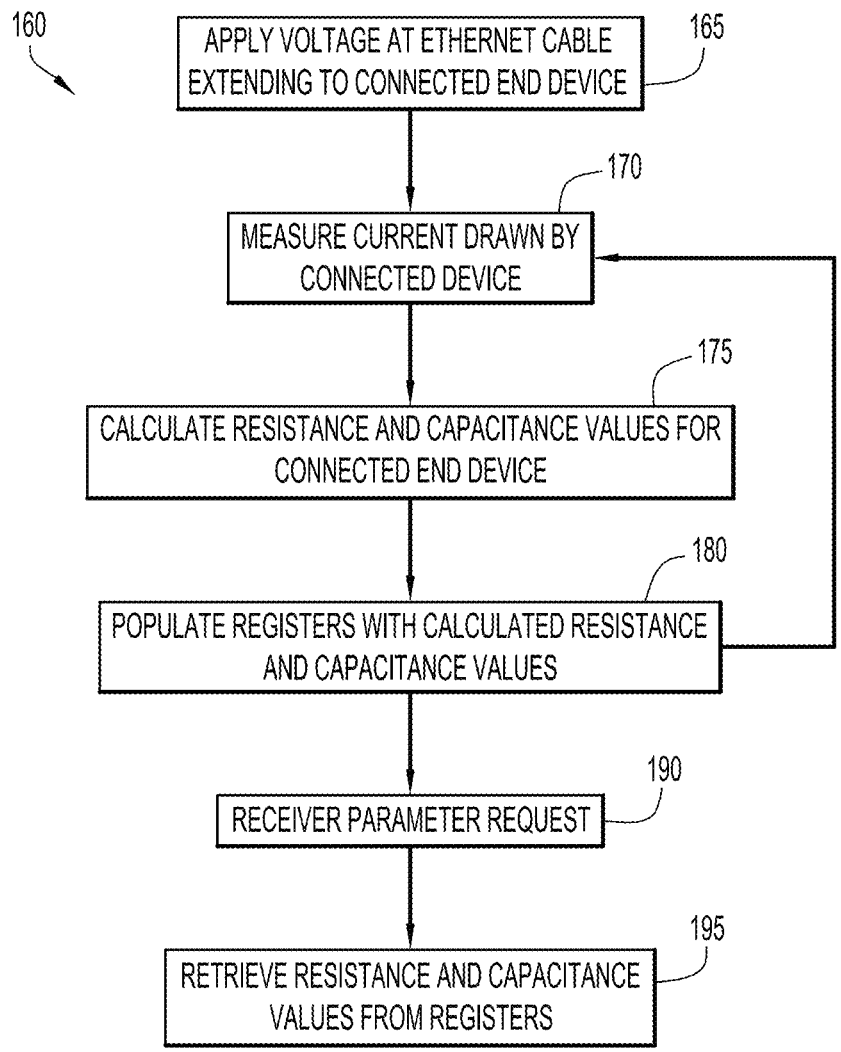
FIG. 3 is a flowchart of a method in accordance with examples presented herein.

FIG. 3 is a flowchart of a method 160 in accordance with examples presented herein. For ease of illustration, the method 160 will be described with reference to the arrangement of FIG. 2. Method 160 begins at 165 where, after a detection process is initiated, the PoE chip 80 applies (provides) a voltage on the Ethernet cable 125 extending from port 115 to the connected end device 120. At 170, the detection and calculation logic 90 measures the current drawn by the connected end device 120 as a result of the applied voltage.

After measurement of the current drawn, at 175 the detection and calculation logic 90 calculates resistance and/or capacitance values for the connected device 120. The detection and calculation logic 90 then populates registers 100 in memory 95 with the calculated resistance and capacitance values. Although not shown in FIG. 3, the detection and calculation logic 90 may also determine, using predetermined resistance and capacitance ranges, whether or not the connected end device 120 is a PD. An indication of whether or not the end device 120 is a PD may also be stored in registers 100.

In accordance with examples presented herein, the detection and storage operations 170, 175, and 180 may be performed periodically to ensure that the end device 120, or another device connected to port 115, satisfies the requirements to receive power over the Ethernet cable 125. As such, after storage of the resistance and capacitance values at 180, the method 160 may then returning to 170 for measurement of the current drawn by the connected end device 120 and subsequent calculation and storage of the resistance and capacitance values.

As noted above, PoE chip 50 may, depending on a manufacturer configuration, detect a connected device differently than other PoE chips. In particular, this occurs when the calculated resistance or capacitance values fall outside or between predetermined ranges, such as those shown in Table 1. As noted above, such a situation may cause an end user to presume that there is a problem with the switch 20, port 115, etc., thereby resulting in the commencement of a troubleshooting process. Accordingly, in such situations, the switch 20 may receive a parameter request at 190. Subsequently, at 195, the resistance and/or capacitance parameter values may be obtained from the registers 100 for use during the troubleshooting process.

Thus, the techniques presented herein provide readily available PD resistance and capacitance values in a register for the ease of debug. This is useful improvement over current techniques that involve manually measuring the resistance and capacitance in a lab environment.

In summary, a method is provided comprising: providing, via a port of a Power over Ethernet (PoE) power sourcing equipment (PSE) device, a voltage to an end device connected to an Ethernet cable that is connected to the port; measuring current drawn by the end device; calculating, based on the measured current, a resistance value for the end device; and storing the resistance value in a memory of the PSE device.

Similarly, an apparatus is provided comprising a first memory; and detection and calculation logic configured to: apply, via a port of a Power over Ethernet (PoE) power sourcing equipment (PSE) device, a voltage to an end device connected to an Ethernet cable that is connected to the port; measure current drawn by the end device; calculate, based on the measured current, a resistance value for the end device; and store the resistance value in the first memory of the PSE device.

The above description is intended by way of example only.

What is claimed is:

1. A method comprising:
   providing, via a port of a Power over Ethernet (PoE) power sourcing equipment (PSE) device, a voltage to an end device that is connected to the port via an Ethernet cable;
   measuring current drawn by the end device;
   calculating, based on the measured current, a resistance value for the end device;
   storing the resistance value in a memory of the PSE device;
   receiving a request for the resistance value; and
   retrieving the resistance value from the memory.

2. The method of claim 1, further comprising:
   calculating, based on the measured current, a capacitance value for the end device; and
   storing the capacitance value in the memory of the PSE device.

3. The method of claim 1, wherein storing the resistance value in the memory of the PSE device comprises:
   storing the resistance value in a register.

4. The method of claim 1, further comprising:
   retrieving the resistance value from the memory with a field programmable gate array; and
   providing the resistance value from the field programmable gate array to a software reporting application.

5. The method of claim 1, further comprising:
   directly retrieving the resistance value from the memory with a software reporting application.

6. The method of claim 1, further comprising:
   transmitting the resistance value to a network analyzer.

7. The method of claim 1, further comprising:
   determining, based on the calculated resistance value, whether the end device is a powered device (PD); and
   storing the resistance value only when it is determined that the end device is not a PD.

8. An apparatus comprising:
   a first memory; and
   detection and calculation logic configured to:
      apply, via a port of a Power over Ethernet (PoE) power sourcing equipment (PSE) device, a voltage to an end device that is connected to the port via an Ethernet cable;
      measure current drawn by the end device;

calculate, based on the measured current, a resistance value for the end device;

store the resistance value in the first memory of the PSE device;

a second memory storing executable instructions for a reporting application; and a processor configured to execute the reporting application to retrieve the resistance value from the first memory.

9. The apparatus of claim 8, wherein the detection and calculation logic is further configured to:

calculate, based on the measured current, a capacitance value for the end device; and store the capacitance value in the memory of the PSE device.

10. The apparatus of claim 8, wherein the first memory comprises a plurality of registers, and wherein the detection and calculation logic is configured store the resistance value in one of the plurality of registers of the first memory.

11. The apparatus of claim 8, further comprising a field programmable gate array, wherein the processor is configured to retrieve the resistance value from the first memory via the field programmable gate array.

12. The apparatus of claim 8, wherein the processor is configured to directly retrieve the resistance value from the first memory.

13. The apparatus of claim 8, wherein the processor is configured to cause the resistance value to be transmitted to a network analyzer.

14. The apparatus of claim 13, wherein the processor is configured to receive a request for the resistance value from the network analyzer.

15. The apparatus of claim 8, wherein the detection and calculation logic is further configured to:

determine, based on the calculated resistance value, whether the end device is a powered device (PD); and store the resistance value only when it is determined that the end device is not a PD.

16. The apparatus of claim 8, wherein the detection and calculation logic comprise hardware elements of a first PoE chip.

17. The apparatus of claim 16, wherein the first memory is part of the first PoE chip.

18. The apparatus of claim 16, further comprising:

a plurality of PoE chips each comprising detection and calculation logic and a memory.

19. An apparatus comprising:

logic configured to:

provide, via a port of a Power over Ethernet (PoE) power sourcing equipment (PSE) device, a voltage to an end device that is connected to the port via an Ethernet cable;

measure current drawn by the end device;

calculate bsed on the measured current, a resistance value for the end device;

store the resistance value in a memory;

receive a request for the resistance value; and retrieve the resistance value from the memory.

20. The apparatus of claim 19, wherein the logic is further configured to:

determine, based on the calculated resistance value, whether the end device is a powered device (PD); and store the resistance value only when it is determined that the end device is not a PD.

* * * * *